United States Patent [19]
Adan

[11] Patent Number: 5,179,033
[45] Date of Patent: Jan. 12, 1993

[54] METHOD FOR MANUFACTURING TFT SRAM

[75] Inventor: Alberto O. Adan, Tenri, Japan

[73] Assignee: Sharp Kabushiki Kaisha, Osaka, Japan

[21] Appl. No.: 754,615

[22] Filed: Sep. 4, 1991

[30] Foreign Application Priority Data

Sep. 5, 1990 [JP] Japan ................... 2-236354

[51] Int. Cl.⁵ .................... H01L 21/265; H01L 21/70
[52] U.S. Cl. ........................ 437/41; 437/47; 437/52; 437/60
[58] Field of Search ........... 437/40, 41, 48, 52, 437/193, 44, 45; 357/23.6, 23.7; 365/178, 141, 180, 187, 198

[56] References Cited

U.S. PATENT DOCUMENTS

| 4,716,548 | 12/1987 | Mochizuki | 365/187 |
| 4,774,203 | 9/1988 | Ikeda et al. | 437/52 |
| 4,828,629 | 5/1989 | Ikeda et al. | 437/52 |
| 4,975,875 | 12/1990 | Ito | 357/54 |
| 5,057,898 | 10/1991 | Adan et al. | 357/23.7 |

FOREIGN PATENT DOCUMENTS

| 3929129 | 4/1990 | Fed. Rep. of Germany | 365/149 |
| 1-166554 | 6/1989 | Japan | 365/149 |

Primary Examiner—Olik Chaudhuri
Assistant Examiner—Loc Q. Trinh
Attorney, Agent, or Firm—Nixon & Vanderhye

[57] ABSTRACT

A method for manufacturing a semiconductor device by (i) depositing a first insulating layer over a semiconductor substrate having a polysilicon gate, and then opening a first contact hole so as to form a first insulating film, (ii) depositing a second polysilicon layer over the semiconductor substrate including the first contact hole, and then patterning the same so as to form a second polysilicon film, (iii) depositing a second insulating film over the semiconductor substrate including the second polysilicon film, and then opening a second contact hole so as to form a second insulating film, (iv) depositing a third polysilicon layer over the semiconductor substrate including the second contact hole, and then patterning the same as to form a third polysilicon film as a capacitor bottom electrode, (v) implanting ions in the second polysilicon film in a region other than a capacitor formation region so as to form a source/drain region, (vi) depositing a third insulating layer over the whole surface, and then opening a contact window so as to form a third insulating film as a capacitor insulating film, and (vii) depositing a fourth polysilicon layer over the semiconductor substrate including the contact window, and then patterning the same so as to make a fourth polysilicon film remain as a capacitor top electrode in only the capacitor formation region.

1 Claim, 11 Drawing Sheets

METHOD FOR MANUFACTURING TFT SRAM

BACKGROUND OF THE INVENTION

1. Field of the Invention

The present invention relates to a method for manufacturing a semiconductor apparatus, and more particularly to the process of manufacturing TFT type Static Random Access Memories (SRAMs) in which resistance to α rays can be improved by applying capacitors to cell nodes.

2. Description of the Prior Art

Conventional SRAMs have relied in the use of an N-type substrate and P-well structure to create a barrier for reducing charge collection from impingement by α-particle.

The use of a buried P+ barrier layer in a P-well has been proposed to reduce the collection charge and soft-error rate.

When the memory cell size is reduced, however, the cell node capacitance becomes smaller and it is hard to store enough charges to compensate the discharge generated by the α-particle.

Figure 5A:
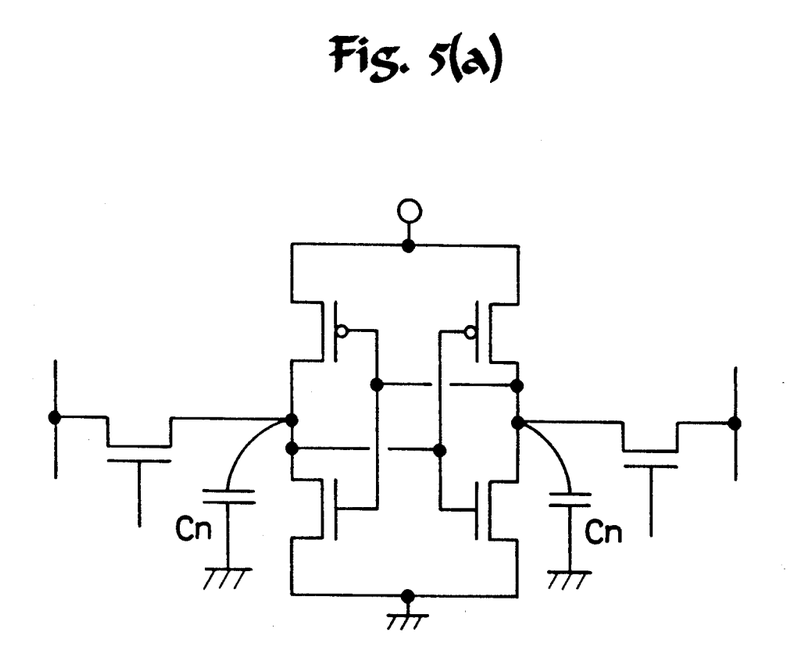
FIG. 5(a) is an equivalent circuit diagram according to the prior art.
Figure 5B:
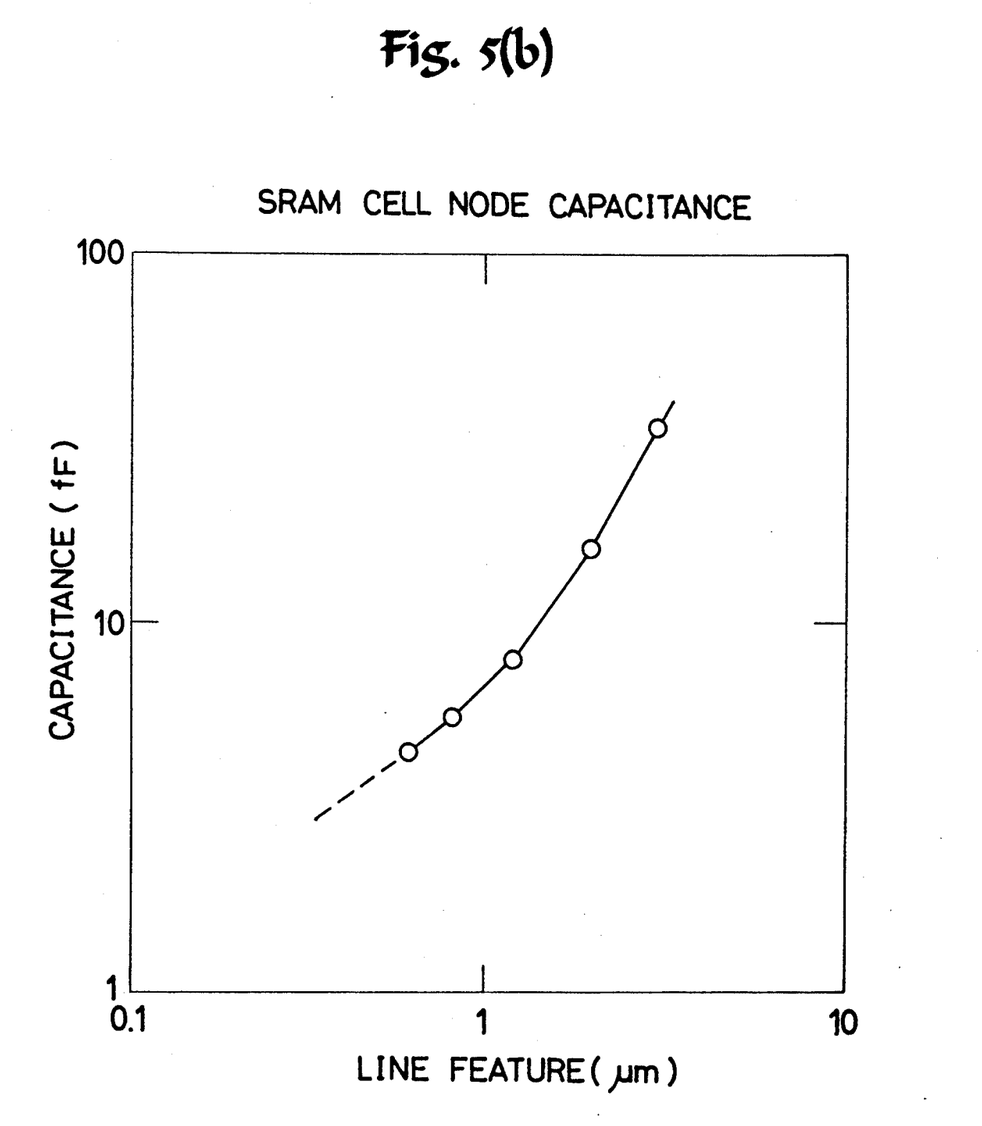
FIG. 5(b) is a characteristic chart showing the relationship between a line width and SRAM cell node capacitance according to the prior art.
Figure 6A:
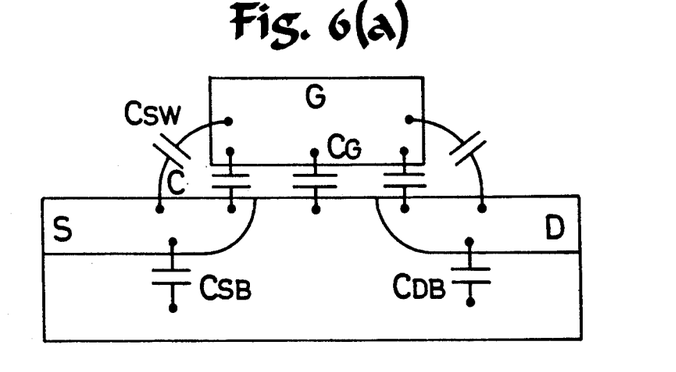
FIG. 6(a) is a view showing MOS transistor capacitance according to the prior art.
Figure 6B:
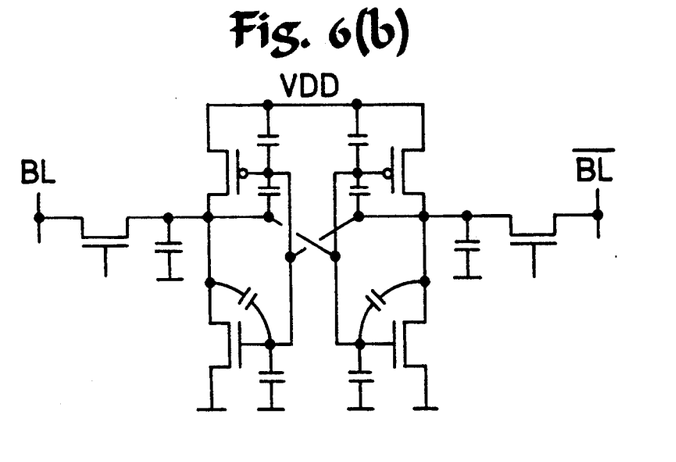
FIG. 6(b) is a view for explaining the operation of a MOS transistor.
Figure 6C:
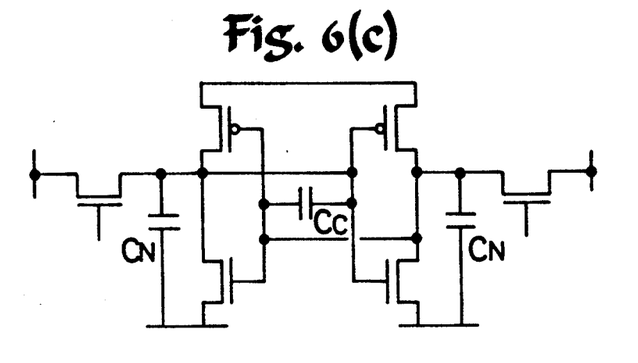
FIG. 6(c) is an equivalent circuit diagram showing the memory cell capacitance of the MOS transistor.

As shown in FIGS. 5(a) and (b), the memory cell parasitic node capacitance is plotted against design rules. In FIG. 5(a), the memory cell parasitic node capacitance is indicated at Cn. As shown in FIGS. 6(a), (b) and (c), the memory cell parasitic node capacitance Cn is composed of the gate oxide capacitance $C_G$ of a cell transistor and diffusion capacitance $C_{DB}$. When the α-particle hits a storage junction node, carriers are generated along a particle track, and induce a noise current which discharges the stored charge. SER (Soft-Error Rate) is characterized by defining a critical charge Qcrit. This is the minimum charge that should be collected from the impingement of an α-particle to cause the data upset. To increase the SRAM cell tolerance of SER to the increase of the memory cell parasitic node capacitance has been recognized, and the use of polysilicon interconnection layers have been proposed.

SUMMARY OF THE INVENTION

The present invention provides a method for manufacturing a semiconductor apparatus, comprising steps of (i) depositing a first insulating layer over a semiconductor substrate having a polysilicon gate formed by a first polysilicon film, and then opening a first contact hole so as to form a first insulating film, (ii) depositing a second polysilicon layer over the semiconductor substrate including the first contact hole, and then patterning the same so as to form a second polysilicon film, (iii) depositing a second insulating film over the semiconductor substrate including the second polysilicon film, and then opening a second contact hole so as to form a second insulating film, (iv) depositing a third polysilicon layer over the semiconductor substrate including the second contact hole, and then patterning the same so as to form a third polysilicon film as a capacitor bottom electrode, (v) implanting ions in the second polysilicon film in a region other than a capacitor formation region so as to form a source/drain region, (vi) depositing a third insulating layer over the whole surface, and then opening a contact window so as to form a third insulating film as a capacitor insulating film, and (vii) depositing a fourth polysilicon layer over the semiconductor substrate including the contact window, and then patterning the same so as to make a fourth polysilicon film remain as a capacitor top electrode in only the capacitor formation region.

In a SRAM Cell with Cross-Coupled Stacked Capacitor, α-ray induced Soft-Error resistance and Qcrit are improved by
1. Combined action of TFT Load current Cross-coupled capacitor, and
2. A memory cell structure and a fabrication process flow which are provided to realize the SRAM cell with Stacked Cross-Coupled Capacitor.

DETAILED DESCRIPTION OF A PREFERRED EMBODIMENT

Figure 3:
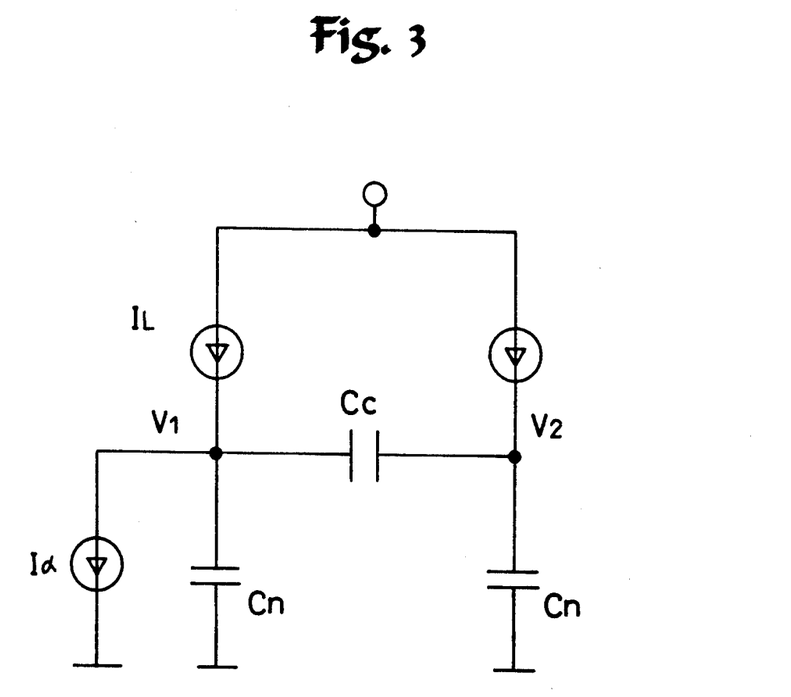
FIG. 3 is a schematic equivalent circuit diagram showing the principles of the device according to the embodiment of the present invention.
Figure 4A:
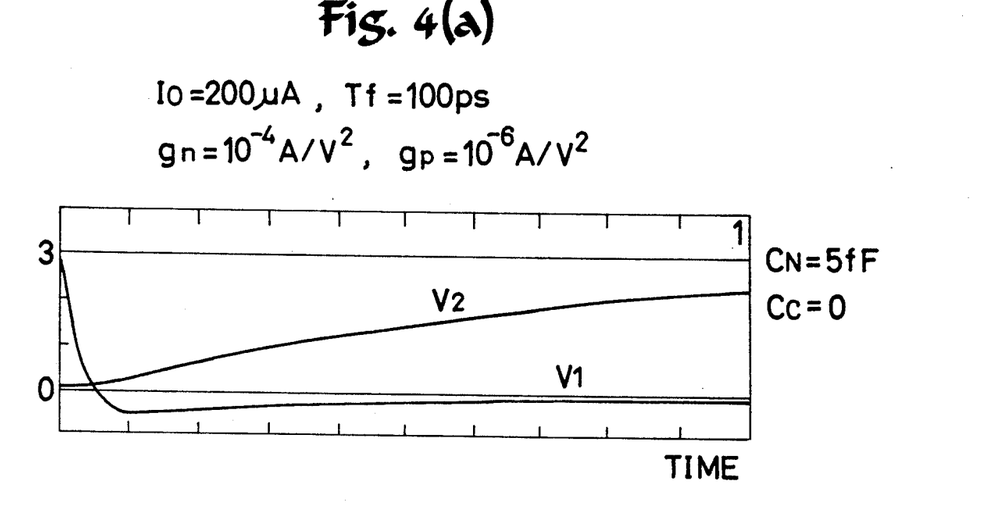
FIGS. 4(a)-4(c) are characteristic charts showing the relationship between a time and a memory cell flip-flop node voltage of the device according to the embodiment of the present invention.
Figure 4B:
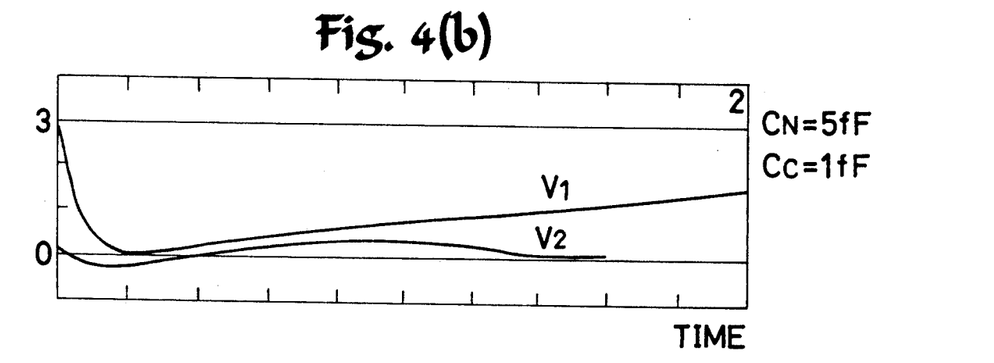
Figure 4C:
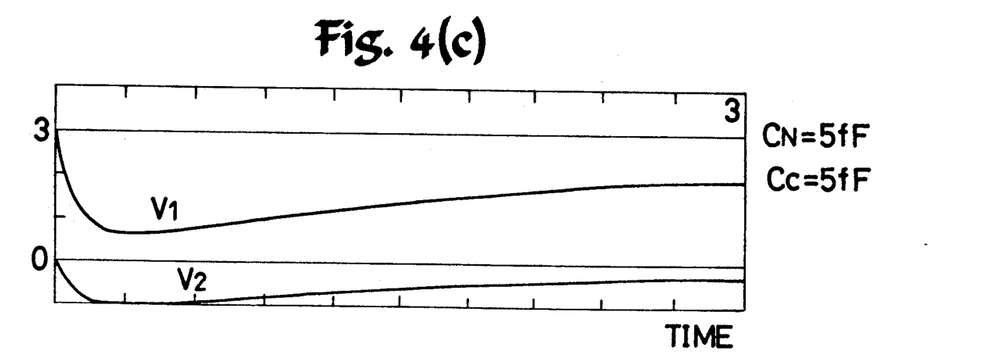

In order to analyze a SRAM cell circuit and its structure, a simple electrical model can be used for estimating the effect of impinging α rays as shown in FIG. 3. Using this circuit, a critical charge Qcrit for data upset is calculated to be:

$$Qcrit = V_H(Cn + 2Cc)/(1 - I_L/I_\alpha) \quad \ldots (1)$$

where:

$V_H$: Signal level at the moment of α rays hitting
Cn: Memory cell parasitic node capacitance
Cc: Memory cell cross-coupling capacitance between cell nodes
$I_L$: Memory cell load device current
$I_\alpha$: Current induced by α-particle As seen from the formula (1), Cc is twice more effective than Cn in increasing Qcrit. The effect of the cross-coupling capacitor is illustrated in the simulation results of FIGS. 4(a), (b) and (c), where memory cell flip-flop node voltages are shown versus the time after hitting of an α-particle. In FIGS. 4(a), (b) and (c), a node V1 initially stores a level "1". As shown in FIG. 4(a), Cc=0 (fF) and Cn=5 (fF) are not enough to prevent data upset. As shown in FIG. 4(b), Cc=1 (fF) is marginally sufficient to prevent the data upset. According to the present embodiment, Cc=5 (fF) is adequate to protect the stored data as shown in FIG. 4(c). Initially, both nodes move together owing to capacitive coupling. Then, a load transistor supplies a current to restore node voltages.

To reduce Soft-Error Rate degradation, Qcrit must be increased. To solve these problems, there is proposed a method for manufacturing a semiconductor apparatus characterized in that:

(i) a first insulating layer is deposited over a semiconductor substrate having a polysilicon gate comprised of a first polysilicon film, and a first contact hole is then opened on the first insulating layer so as to form a first insulating film, (ii) a second polysilicon layer is deposited over the semiconductor substrate including the first contact hole, and then is patterned to form a second polysilicon film, (iii) a second insulating layer is deposited over the semiconductor substrate including the second polysilicon film, and a second contact hole is then opened on the second insulating layer so as to form a second insulating film, (iv) a third polysilicon layer is deposited over the semiconductor substrate including the second contact hole, and then is patterned to form a third polysilicon film as a capacitor bottom electrode, (v) ions are implanted in the second polysilicon film in a region other than a capacitor formation region so as to form a source/drain region, (vi) a third insulating layer is deposited over the whole surface, and a contact window is then opened to form a third insulating film as a capacitor insulating film, and (vii) a fourth polysilicon layer is deposited over the semiconductor substrate including the contact window, and then is patterned to make a fourth polysilicon film remain as a capacitor top electrode in only the capacitor formation region.

The present invention provides
(1) fabricating a cross-coupled capacitor between memory cell flip-flop storage nodes, and
(2) the use of active load devices (PMOSTFT) to
 (i) reduce the recovery time of the voltage at the node storing a "1" at high speed operation, and
 (ii) improve the ratio of load currents to α-particle induced currents.

According to the present invention, resistance to α rays can be improved by applying capacitors to cell nodes in a TFT type SRAM. The present invention has the structure in which the conventional memory cells have new capacitor insulating films and electrode polysilicon layers.

A preferred embodiment of the present invention will be described in more detail with reference to the drawings. The present invention is not limited to the following embodiment.

Figure 2A:
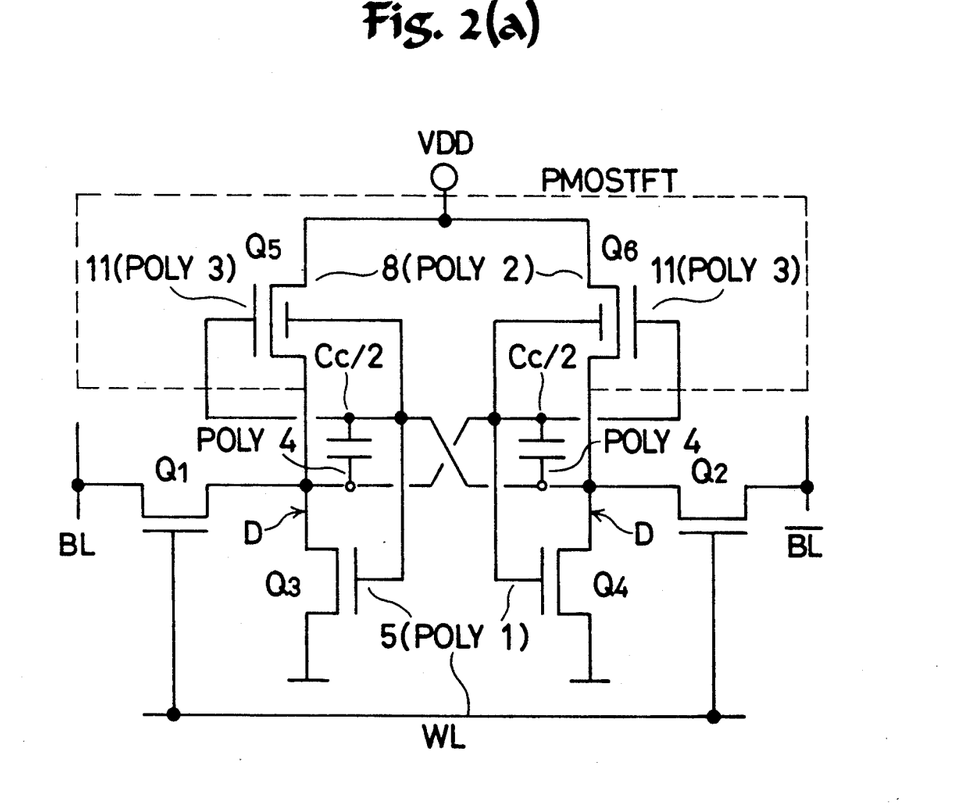
FIG. 2(a) is an equivalent circuit diagram of a device according to the embodiment of the present invention.

The new memory cell structure incorporating a cross-coupled capacitor is shown in FIGS. 2(a), (b) and (c). It comprises bulk access transistors Q1 and Q2 which are connected to bit lines BL and to drains D of bulk transistors Q3 and Q4. The bit line BL is indicated at 24 in FIG. 2(b). The bulk transistors Q3 and Q4 constitute the pull-down devices of a memory cell.

Figure 2B:
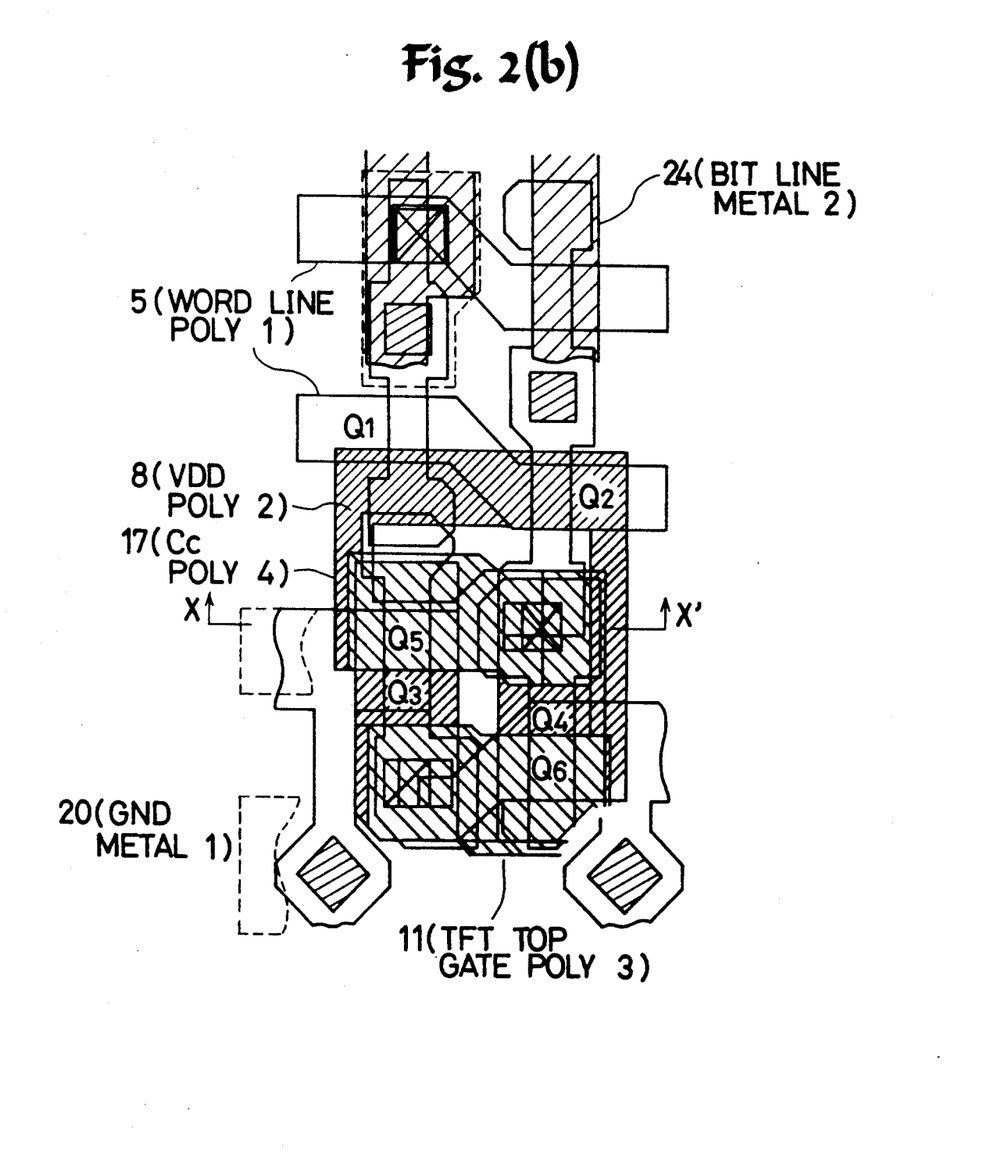
FIG. 2(b) is a view for explaining the structure of the device according to the embodiment of the present invention.
Figure 2C:
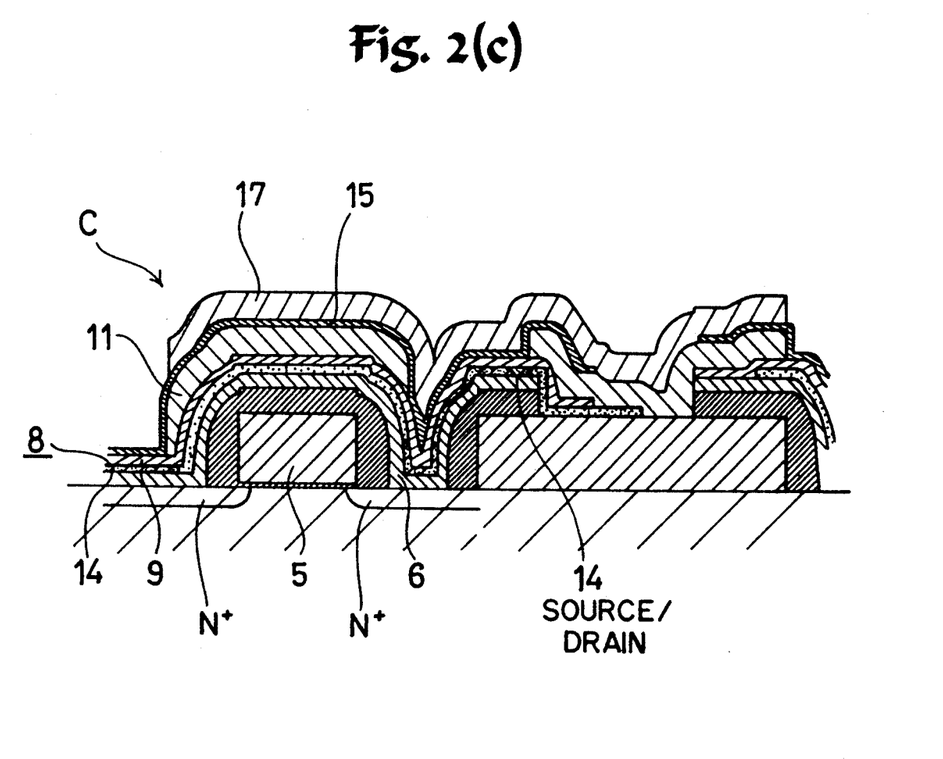
FIG. 2(c) is a view seen in the direction of the line X—X shown in FIG. 2(b)

As shown in FIGS. 2(b) and (c), the gate of the bulk transistor is formed by a first deposited polysilicon layer 5.

As shown in FIG. 2(c), polysilicon MOS transistors Q5 and Q6 are isolated from the bulk transistors by a first CVD oxide layer 6.

As shown in FIG. 2(c), a second polysilicon layer 8 constitutes a power supply line and a polysilicon MOS transistor body.

A second CVD oxide layer 9 shown in FIG. 2(c) is deposited over the second polysilicon layer 8 [see FIG. 2(b)]. Consequently, a polysilicon MOS transistor gate insulating film is formed. According to the present embodiment, a gate insulating film 9 is a top gate oxide film for a TFT which is composed of a HTO film as shown in FIG. 2(c).

A top gate electrode 11 for a polysilicon PMOS device is formed on the gate insulating film 9 [see FIGS. 2(b) and (c)].

The polysilicon film of the top gate electrode is a bottom electrode 11 of a cross-coupled capacitor as described below.

The transistors Q3, Q4, Q5 and Q6 are connected to one another so as to form a memory cell flip-flop.

As shown in FIG. 2(c), a cross-coupled capacitor C is composed of the capacitor bottom electrode 11, a capacitor insulating film 15 and a capacitor top electrode (second electrode) 17. The capacitor bottom electrode 11 constitutes one of electrodes. The capacitor insulating film 15 is deposited over the polysilicon TFT top gate electrode 11. The capacitor top electrode 17 is formed by a fourth polysilicon layer.

After the polysilicon PMOS transistor is formed, a third insulating layer 15 is deposited to form a cross-coupled capacitor insulating layer 15.

Figure 1A:
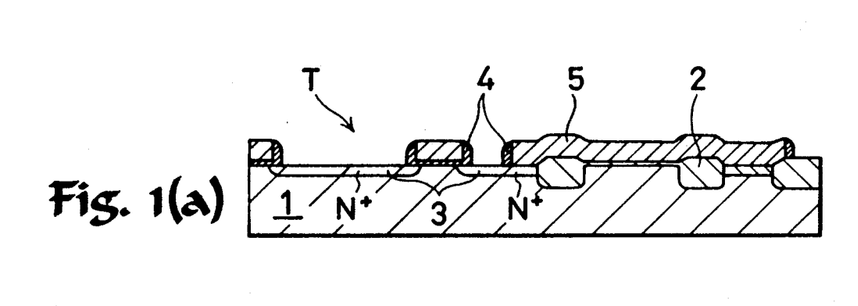
FIGS. 1(a)-1(p) show manufacturing steps according to an embodiment of the present invention.
Figure 1B:
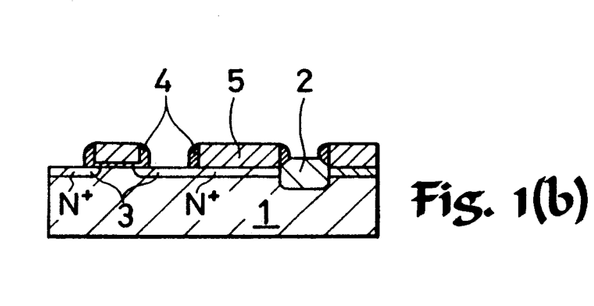
Figure 1C:
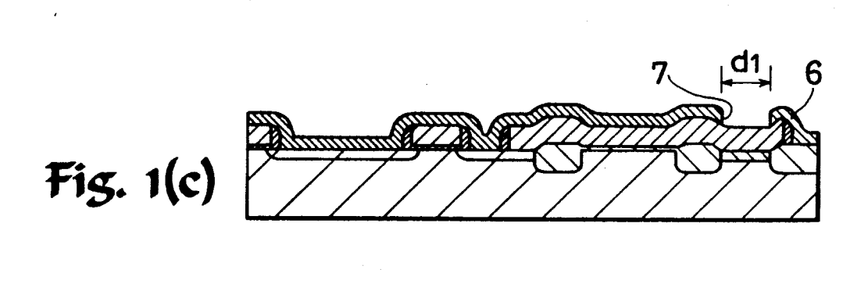
Figure 1D:
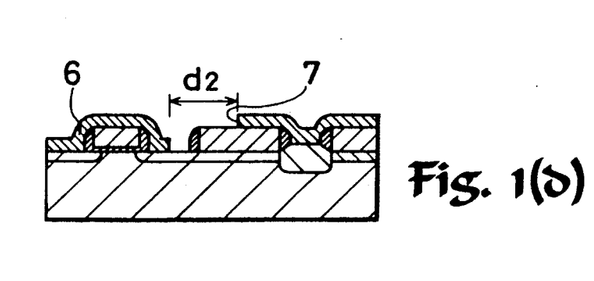
Figure 1E:
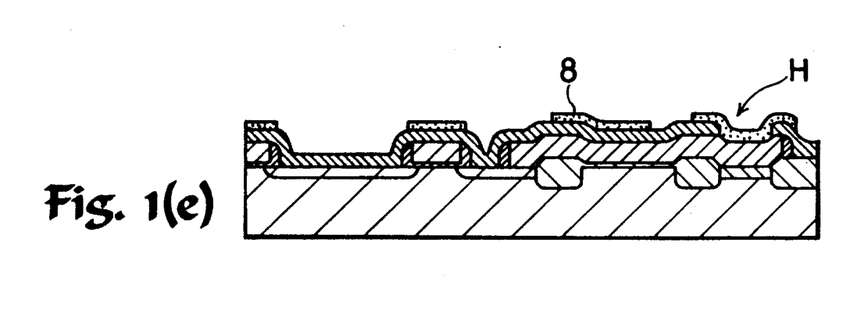
Figure 1F:
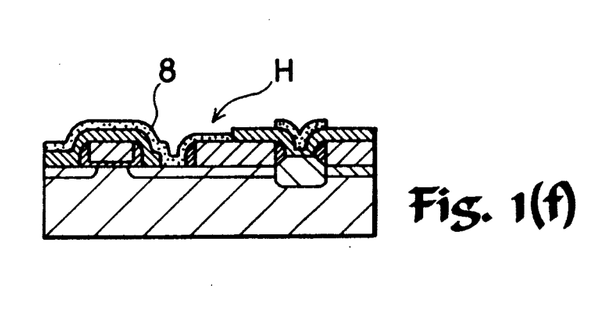
Figure 1G:
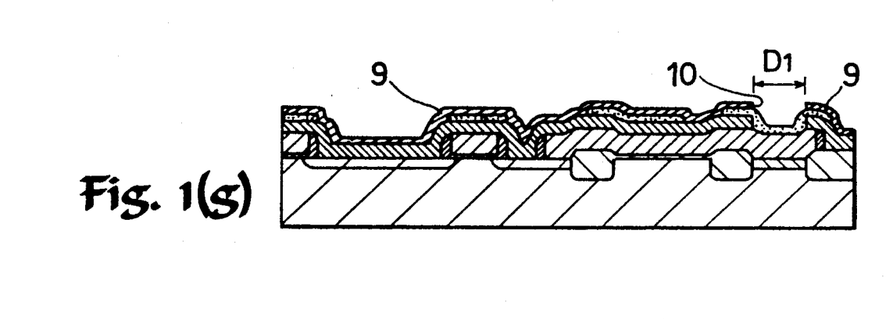
Figure 1H:
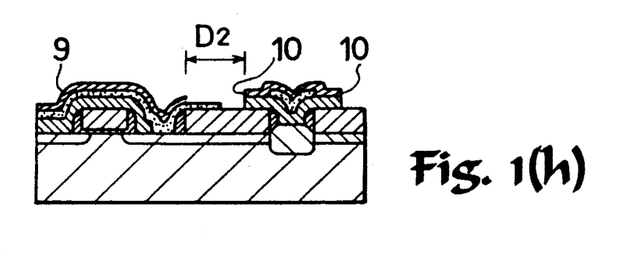
Figures 1I, 1K:
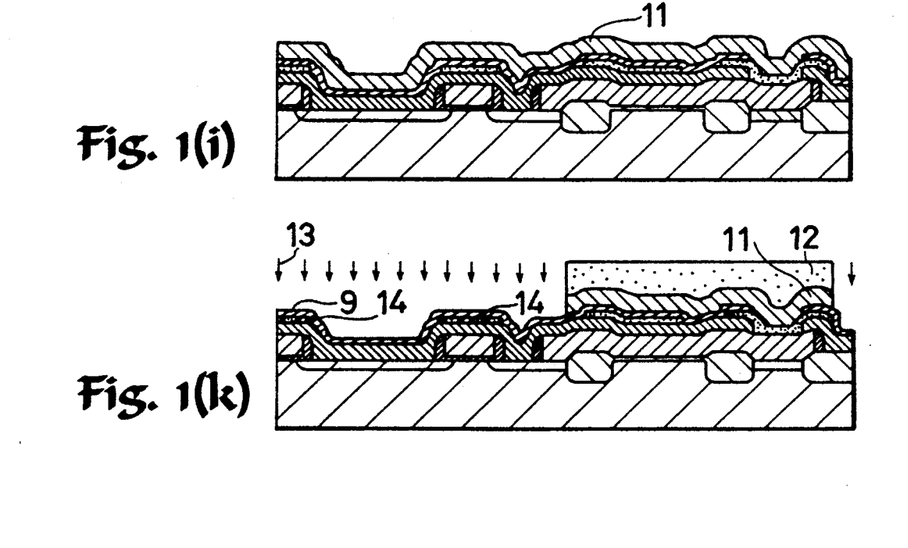
Figure 1J:
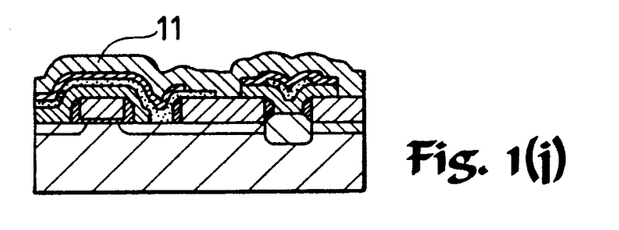
Figure 1L:
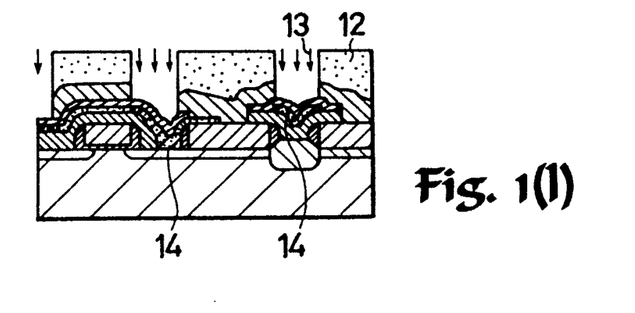
Figures 1M, 1O:
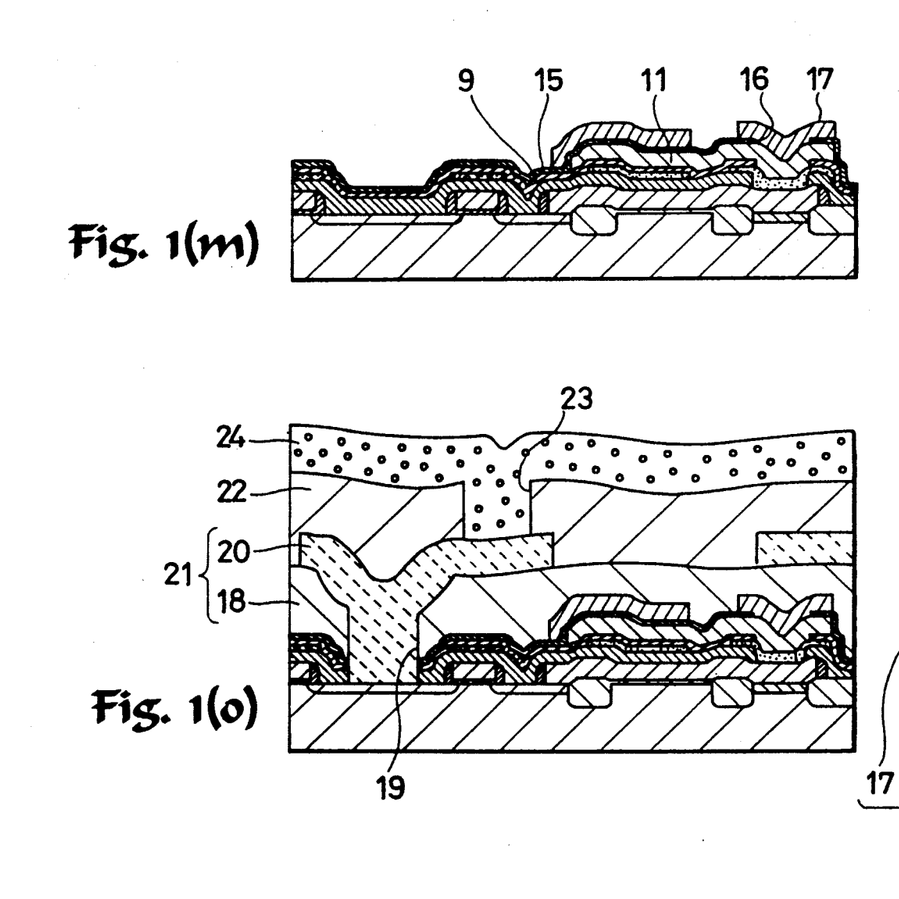
Figure 1N:
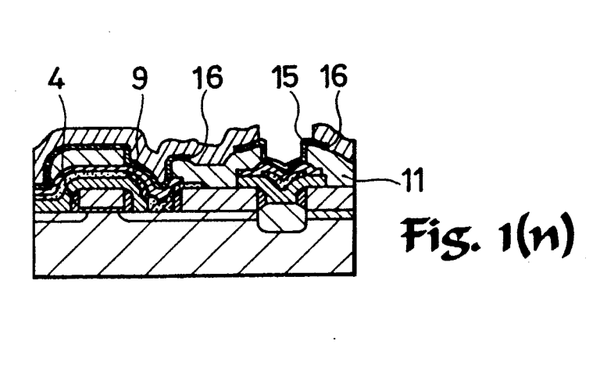

As shown in FIGS. 1(m) and (n), a contact window 16 is opened. Then, the fourth polysilicon layer 17 is deposited and patterned to form a cross-coupled capacitor electrode.

Figure 1P:
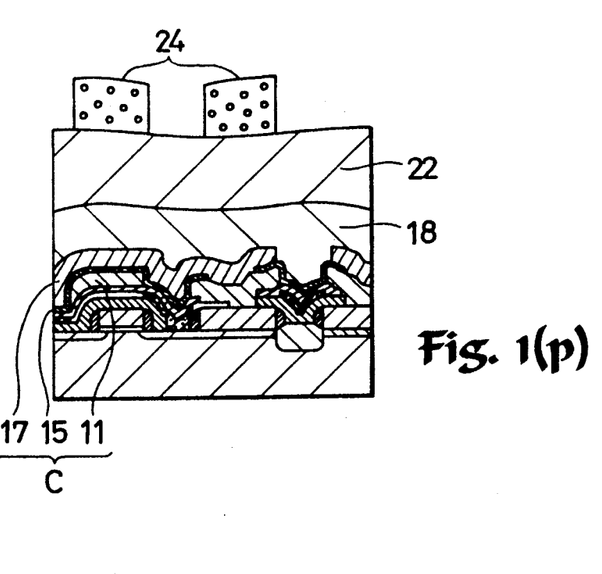

As shown in FIGS. 1(o) and (p), insulating layers 18 and 22 and interconnection metal layers 20 and 24 form ground lines and bit lines. The ground lines are connected to the sources of the bulk transistors Q3 and Q4. Thus, an element is produced.

There will be described a manufacturing method.
A novel SRAM cell is produced in a MOS forming process as follows.

As shown in FIGS. 1(a) and (b), a bulk N-channel polysilicon gate transistor T is formed on a silicon substrate 1 by using the well-known MOS forming process. The bulk N-channel polysilicon gate transistor T is comprised of a polysilicon gate (first polysilicon film) 5 including a $SiO_2$ LOCOS oxide film 2, an N+ diffusion layer 3 and a $SiO_2$ side wall 4.

Then, a $SiO_2$ CVD oxide film layer is deposited over the whole surface to form a polysilicon MOS transistor bottom gate insulating film (polysilicon MOS transistor bottom gate dielectric: referred to as a first insulating film) 6. Thereafter, a first contact hole 7 is opened on the insulating film 6 by photoetching techniques [see FIGS. 1(c) and (d)]. The first contact hole 7 has a length d1 of about 0.6 μm and a width d2 of about 0.6 μm.

FIGS. 1(c) and (d) are views showing the same process seen in the different directions. FIG. 1(d) is a view for explaining manufacturing steps seen in the perpendicular direction to FIG. 1(c). FIGS. 1(a) and (b) and FIGS. (e) to (p) are similar.

Subsequently, a polysilicon layer (second polysilicon film) 8 is deposited over the silicon substrate 1 including the contact hole 7, and then is patterned by photoetching techniques so as to form a polysilicon transistor body H [see FIGS. 1(e) and (f)].

Then, a HTO film is deposited as a CVD oxide layer over the silicon substrate 1 including the second polysilicon film 8 which is patterned. Consequently, a polysilicon transistor top gate insulating film (polysilicon transistor top gate dielectric: referred to as a second insulating film) 9 is formed. Thereafter, a second contact hole 10 is opened on the insulating film 9 by the photoetching techniques [see FIGS. 1(g) and (h)]. The second contact hole 10 has a length D1 of about 0.6 μm and a width D2 of about 0.6 μm.

A polysilicon layer (third polysilicon film) 11 is deposited over the silicon substrate 1 including the contact hole 10 so as to form a polysilicon transistor top gate electrode (a top gate electrode), i.e., the bottom electrode of a stacked cross-coupled capacitor [see FIGS. 1(i) and (j)].

Then, the third polysilicon layer 11 is removed in a predetermined region by using a photoresist 12 as a mask. Thereafter, boron ions ($^{11}B^+$) 13, which are P-type impurities, are implanted in the removing region through the HTO film 9 so as to form a source/drain region 14 of the TFT polysilicon transistor [see FIGS. 1(k) and (l)].

Subsequently, a third insulating film is deposited over the silicon substrate 1 including the HTO film 9 and the residual third polysilicon film 11 so as to form a cross-coupled capacitor insulating film 15. Then, a contact window 16 is opened by the photoetching techniques. Thereafter, a fourth polysilicon layer is deposited over the silicon substrate 1 including the contact window 16, and then is patterned to form a top electrode 17 of the stacked capacitor [see FIGS. 1(m) and (n)].

Finally, a second layer insulation film 22, a second contact portion 23 and a second metal film 24 are formed over the whole surface through an intermediate coupling layer 21 by using the well-known method. The second contact portion 23 is opened on the second layer insulation film 22. The second metal film 24 is formed by patterning. The intermediate coupling layer 21 is comprised of a first layer insulation film 18, a first contact portion 19 and a first metal film 20. The first contact portion 19 is opened on the first layer insulation film 18. The first metal film 20 is formed by patterning. Thus, a device is completed [see FIGS. 1(o) and (p)].

According to the present invention, the SRAM cell capacitance and critical stored charge Qcrit can be increased by the stacked cross-coupled capacitor.

The cross-coupled capacitor can be stacked on the memory cell, so that there is no increase in cell area.

Furthermore, the transistor characteristics of the Double-Gated MOS Polysilicon Thin Film Transistors can be improved. In addition, the high drive current of the Double-Gated TFT, combined with the higher cell capacitance owing to the cross-coupled capacitor, results in improved soft error resistance.

What is claimed is:

1. A method for manufacturing a static RAM having a thin film transistor, comprising the steps of:
   (i) forming on a semiconductor substrate a MOS transistor with a gate electrode made of a first polysilicon film and serving as a gate electrode of a bulk transistor and as a bottom electrode of the thin film transistor;
   (ii) depositing a first insulating layer over the entire substrate surface including the MOS transistor, and then etching a first contact hole in the first insulating layer;
   (iii) depositing a second polysilicon layer over the entire substrate surface including the first contact hole, and then patterning the same so as to form a body of the thin film transistor, said first polysilicon film being connected to said second polysilicon layer at said first contact hole;
   (iv) depositing a second insulating layer over the entire substrate surface including the patterned second polysilicon layer, and then etching a second contact hole in the second insulating layer;
   (v) depositing a third polysilicon layer over the entire substrate surface including the second contact hole, and then patterning the same so as to form a top gate electrode of the thin film transistor which at the same time serves as a capacitor bottom electrode, thereby connecting the first polysilicon film with the patterned third polysilicon layer;
   (vi) implanting ions with use of the patterned third polysilicon layer as a mask to form source/drain regions for the thin film transistor;
   (vii) depositing a third insulating layer as a capacitor insulating film over the entire substrate surface, and then opening a third contact hole in the third insulating layer; and
   (viii) depositing a fourth polysilicon layer over the entire substrate surface including the third contact hole, and then patterning the same so as to form a capacitor top electrode.

* * * * *